US009641135B2

(12) United States Patent
Arcidiacono et al.

(10) Patent No.: US 9,641,135 B2
(45) Date of Patent: May 2, 2017

(54) METHOD FOR DETECTING AN UNBALANCE AND FOR CALIBRATING A MULTI-PORT AMPLIFIER OF A TELECOMMUNICATIONS SATELLITE

(71) Applicant: EUTELSAT SA, Paris (FR)

(72) Inventors: Antonio Arcidiacono, Paris (FR); Daniele Vito Finocchiaro, Paris (FR); Alessandro Le Pera, Issy-les-Moulineaux (FR); Yan Brand, Suresnes (FR)

(73) Assignee: EUTELSAT S A, Paris (FR)

( * ) Notice: Subject to any disclaimer, the term of this patent is extended or adjusted under 35 U.S.C. 154(b) by 0 days.

(21) Appl. No.: 14/638,276

(22) Filed: Mar. 4, 2015

(65) Prior Publication Data

US 2015/0256134 A1 Sep. 10, 2015

(30) Foreign Application Priority Data

Mar. 4, 2014 (FR) ...................................... 14 51739

(51) Int. Cl.
*H03F 3/68* (2006.01)
*H03F 1/32* (2006.01)
*H04B 7/185* (2006.01)

(52) U.S. Cl.
CPC ........... *H03F 1/32* (2013.01); *H04B 7/18515* (2013.01); *H03F 3/68* (2013.01); *H03F 2201/3212* (2013.01)

(58) Field of Classification Search
CPC .. H03F 1/32; H03F 2201/3212; H03F 1/3247; H03F 1/3282; H03F 3/19;

(Continued)

(56) References Cited

U.S. PATENT DOCUMENTS 4,618,831 A * 10/1986 Egami ....................... H01P 5/16
                                                         330/124 R
5,604,462 A *  2/1997 Gans ......................... H03F 1/32
                                                         330/124 D (Continued)

OTHER PUBLICATIONS

Preliminary Search Report as issued in French Patent Application No. 1451739, dated Jan. 12, 2015.

*Primary Examiner* — Khanh V Nguyen
(74) *Attorney, Agent, or Firm* — Pillsbury Winthrop Shaw Pittman LLP

(57) ABSTRACT

A method for detecting an unbalance of a multi-port amplifier MPA intended to be on-board a satellite is presented. The MPA includes a plurality of paths, each path being configurable in gain and phase. The method includes transmitting a first test signal which is spread spectrum modulated from the first transmitting station to the first pathway, the first test signal being generated in at least the useful band of the first pathway; receiving by the second receiving station configured in frequency to receive signals transmitted by the second antenna connected to the second path of the MPA, the signals being likely to include a replica of the first test signal; detecting and measuring a power of received signals corresponding to a replica of the first test signal having leaked at the output of the second output port; computing at least one unbalance value of the MPA from the measurement of the power of the replica of the first test signal received in the second earth station.

24 Claims, 6 Drawing Sheets

(58) Field of Classification Search
CPC ........ H03F 3/24; H03F 3/68; H03F 2200/192; H03F 2200/207; H03F 1/0277; H03F 1/3258; H03F 3/211
USPC ................................ 330/2, 53, 54, 286, 295
See application file for complete search history.

(56) References Cited

U.S. PATENT DOCUMENTS

| | | | | |
|---|---|---|---|---|
| 5,675,285 | A * | 10/1997 | Winters | H03F 3/602 330/124 R |
| 5,764,104 | A * | 6/1998 | Luz | H03F 3/60 330/124 R |
| 5,783,969 | A * | 7/1998 | Luz | H03F 3/602 330/124 R |
| 5,834,972 | A * | 11/1998 | Schiemenz, Jr. | H03F 3/602 330/124 R |
| 5,955,920 | A * | 9/1999 | Reudink | H03F 3/602 330/124 R |
| 6,243,038 | B1 * | 6/2001 | Butler | H01Q 3/26 330/124 R |
| 6,650,876 | B1 * | 11/2003 | Ostman | H01Q 1/246 330/124 R |
| 7,139,539 | B2 * | 11/2006 | Chun | H01Q 3/2605 330/124 R |
| 7,804,358 | B2 * | 9/2010 | Petersson | H01Q 3/28 330/124 R |
| 8,570,103 | B2 * | 10/2013 | Chang | H03F 1/0277 330/124 R |
| 8,581,663 | B2 * | 11/2013 | Tronche | H03F 1/3247 330/124 R |
| 2003/0017827 | A1 | 1/2003 | Ciaburro et al. | |
| 2010/0148860 | A1 | 6/2010 | Rhodes et al. | |

\* cited by examiner

METHOD FOR DETECTING AN UNBALANCE AND FOR CALIBRATING A MULTI-PORT AMPLIFIER OF A TELECOMMUNICATIONS SATELLITE

CROSS REFERENCE TO RELATED APPLICATIONS

This application claims the benefit of priority from French Patent Application No. 1451739 filed on Mar. 4, 2014, the entire content of which is incorporated herein by reference.

FIELD

The field of the invention relates to methods for detecting an unbalance and for calibrating a multi-port amplifier of a telecommunications satellite.

The field of the invention is applicable to tests and calibrations of a multi-port amplifier including a plurality of amplification channels allowing signals to be decomposed, amplified and recomposed between at least one input port and an output port. The field is applicable to measurements of unbalances and to calibrations of a multi-port amplifier called MPA both when the satellite is in a testing phase before its final orbit insertion and in an operational phase at any moment of its lifetime.

The field of the invention relates to tests that can be carried out without service outages while minimizing interference effects of the neighboring systems or interferences that can be caused by its own system.

BACKGROUND

When a telecommunications satellite is launched into its operational orbit, a number of tests should be carried out to make sure that all the functionalities are validated before putting it in an operational state.

It also happens that a number of tests are performed during the operational phase of the satellite. These tests should preferentially be performed without service outages in particular with regard to operators exploiting broadcasting pathways passing through the satellite.

Telecommunications satellites also ensure a repeater function, that is they retransmit in a predefined zone a signal sent to the satellite for example for a TV broadcasting application.

The satellite comprises a set of equipment forming for example a signal controlling, processing, amplifying, addressing and broadcasting system.

A particularly sensitive equipment is the amplification chain which can comprise one or more amplification channel (s) corresponding to a demultiplication of the satellite capabilities. These channels are called "paths" when they allow signals arriving at the input ports of the MPA to be decomposed and recomposed. The MPA comprises components in particular of a so-called "Butler" matrix allowing components divided by an input block to be amplified and phase shifted and to be recomposed by an output block at the output ports. Each transmission pathway is allocated to an input port and an output port. The signals of a pathway can thus be, at the input of the MPA, decomposed in different paths and recomposed after amplification at the output to be conveyed to a transmitting antenna of said pathway.

Currently, different repeater solutions integrate a multi-port amplifier on-board a telecommunications satellite. An amplification path of a satellite repeater generally comprises a travelling wave tube amplifier. This is a wide band amplifier with a very low background noise. Generally, a telecommunications satellite includes an MPA enabling several paths to be processed enabling the amplification of components of signals from different pathways of a certain bandwidth of frequencies. Each pathway can be "rented" or used by broadcasters or operators. It is thus desirable that each path amplifying and phase shifting the components of an input signal of the MPA be calibrated so as to provide an orthogonality function between the components divided in the different paths of the MPA.

The multi-port amplifiers are particularly used for missions requiring the coverage of a plurality of places, each designating an earth station. The satellite allows the transmission of a plurality of downlink beams generated from a power management adapted to each pathway and a management of assignment of input and output ports and conveying signals to the satellite antennas. These solutions allow flexibility regarding the allocation of the power required on each output port of a multi-port amplifier.

The multi-port amplifiers are commonly called "MPA" in the state of the art.

Generally, an MPA comprises for each of its pathways a travelling wave tube amplifier (TWTA). It is reminded that the TWTA is a vacuum tube used in microwaves to make low, medium or high power amplifiers. It enables wideband and very low background noise amplifiers to be made. It is particularly suitable for the amplifiers of communication satellites.

Further, an MPA comprises a network for forming beams enabling one or more beam(s) emitted with a given power, phase and direction to be developed. An example of such a commonly used network is a Butler matrix with N inputs and N outputs and a specific configuration of paths comprising amplifiers and phase shifters and allowing the achievement of a configuration of phase shifting and amplifying the components from the input signals of the MPA which are divided to obtain one or more desired output signal(s) of the MPA.

In a nominal operation, if a pathway is defined between the input port N° 1 and the output port N° 1, then a signal conveyed to the input port N° 1 is only present on the output port N° 1. The feature of an MPA is that the signals of a same pathway are phase shifted in each of the paths according to a plan defining the phase shifts from one path to the other. In each path, the phase shifted signals are amplified by a TWTA type amplifier. In practice, a chosen design of a network for forming and recomposing beams can be ensured by a Butler matrix. The latter provides a so-called "unate function". The unate function contributes to the formation of a recomposed beam at an output of the matrix and potentially to the formation of N recomposed beams at each of the outputs.

One benefit is that each active TWTA contributes to the amplification of signals of different pathways. If a plurality of signals, separated in frequencies, are routed to the different inputs of a matrix, each TWTA amplifies the signals of each pathway.

When an MPA is well calibrated, the signals conveyed to a first input port of a pathway are only present at the output of a first output port. A problem occurs when the calibration between the different paths of the MPA is not properly performed. Indeed, a phase and/or amplitude drift of the components between the different paths can result in making resultants of components of signals at the output of the MPA non-null whereas a configuration of the MPA provides that the latter should be substantially null at the output of the other output ports. This results from a functionality of a Butler matrix as detailed in FIG. 2 which enables components of signals in opposite phase at the output of the MPA to be cancelled. This problem is generally called an unbalance of the MPA.

An unbalance of an MPA can cause different consequences among which:
- a reduction in the power of a main signal at the output of a port of the matrix because the summation of the in-phase components are slightly phase shifted.
- the reduction in the power of a main signal at the output of a port of the matrix caused by a gain difference between different paths of an MPA;
- the creation of significant signal levels, called leaks, at the outputs of some ports because of a phase shift drift which does not make a resultant of components summed among each other in opposite phases substantially null any longer.

A commonly accepted limit is that the power of the leaks should be in the order of a power 25 dB lower than the power of the main signal on the same pathway.

Today, a way to solve the problem of the unbalance of an MPA is to parameterize the phases and amplitudes of each TWTA pathway. But a problem related to decalibration or unbalance of the pathways remains present with aging of the TWTA modules or even aging of the inputs and outputs of a Butler matrix or other components.

Another drawback of this solution is that when a TWTA is failing and a second TWTA is chosen to replace it, it is not previously calibrated in amplitude and phase relative to the other TWTA of the MPA.

It is thus desirable to measure the amplitude and phase unbalances of a path of the MPA relative to the other amplification paths to dynamically correct the calibration. Finally, one of the major problems encountered is to carry out measurements and a recalibration without disturbing current communications of the MPA on each of the other paths.

A first known solution consists of measurements performed on-board the satellite and transmitted to the ground in a so-called "open loop" architecture. In this solution, the calibration of a path of the MPA is performed by carrying out measurements on the signals of outputs of the matrix. On-board RF detectors are then used which are connected by means of one or more coupler(s) to ports non-used by the transmissions relayed in the satellite. RF detectors enable power levels of the signals at the output of the non-used ports to be measured. The measurements are performed on each port independently of each other. The measurements are then transmitted to a ground station by means of the telemetry link. For example, an increase in the RF level measured at the output of one of the ports relative to the level injected reflects a degradation in the calibration of the MPA.

A problem of this solution is that it depends on the operational configuration chosen in particular according to the choice of the input levels of the test signals transmitted. The measurements sent to a ground station can be unusable or unexploitable to deduce therefrom a recalibration to be performed. The major drawback of this solution is the test dependence on the chosen operational configuration.

A second solution consists of measurements performed on-board the satellite and transmitted to the ground in a so-called "closed loop" architecture. One or more test signal(s) is (are) generated on-board by means of a DSP and is/are injected in one or more input ports of the matrix. The signals at the output of the output ports are collected via one or more calibrated coupler(s). The input signals are also injected by means of a calibrated coupler on the input port of the matrix.

The outputs of the matrix can be looped back to the DSP such that the latter adjusts the phase shifts and amplitude differences of the signal generated at the input of the matrix.

The drawback of such a system is to be expensive. Further, it is desirable to take a complex architecture on-board the satellite in particular by providing a ASP especially designed to perform this calibration test. Hence, the components add further weight on-board the satellite.

A third solution consists in directly receiving the signals transmitted on the channels to be tested/calibrated in a plurality of ground stations. The frequency band and directivity of the antennas are then chosen so as to allow these transmissions from the satellite. An exemplary implementation consists for example in choosing a main earth station on which a main signal is transmitted from the satellite. The antenna and the corresponding pathway of the satellite are configured to transmit this main signal on a predefined station. Besides, a plurality of places geographically distinct from the main station each corresponding to the transmission on a pathway of the MPA are chosen. This method consists in measuring losses of lines of the primary pathway on at least one other pathway by measuring in each place the received power corresponding to the signals of the primary pathway. For this, the RF levels on each of the pathways are measured on the ground for each place. After the signals are reconstituted, within the antenna attenuations, it is possible to deduce the line losses caused by the MPA. Comparisons of the signals received enable losses caused by an unbalance in one or more pathways of the MPA to be deduced and isolated.

A major drawback of this solution is that it disturbs the current telecommunications of the satellite when it is in an operational configuration.

In conclusion, today solutions for measuring an unbalance of the MPA and correcting these unbalances are either expensive, or difficult to implement and disturbing for current operational communications when the satellite is operational.

SUMMARY

An aspect of the invention enables the abovementioned drawbacks to be solved.

An aspect of the invention relates to a method for detecting an unbalance in a multi-port amplifier MPA intended to be on-board a satellite, the multi-port amplifier comprising a plurality of paths, each path being configurable in gain and phase, the multi-port amplifier MPA comprising a plurality of input ports and a plurality of output ports, each input port being associated with an output port to form a transmission channel called a "pathway", each output port being connected to an antenna of the satellite. A first pathway is configured in frequency in a transmission channel defining a first useful band to receive the signals from a transmitting ground station and to retransmit them after amplification in the multi-port amplifier MPA to a first earth station from a first geographical zone, a second output port of a second pathway being configured to transmit via a second antenna to a second earth station of a second geographical zone.

The method comprises:
- transmitting a first test signal which is spread spectrum modulated from the first transmitting station to the first pathway of the multi-port amplifier, the first test signal being generated in at least the useful band of the first pathway;
- receiving by the second receiving station configured in frequency to receive signals transmitted by the second antenna connected to the second path of the multi-port amplifier, said signals being likely to comprise a replica of the first test signal;

detecting and measuring at least one power of received signals corresponding to a replica of the first test signal having leaked at the output of the second output port;

computing at least one unbalance value of the MPA from the measurement of the power of the replica of the first test signal received in the second earth station:

Beneficially, the MPA comprises a Butler matrix comprising:

an input module for generating, from the first test signal, a plurality of phase shifted components with a same amplitude to a plurality of paths connecting the input module to an output module;

a plurality of paths each comprising at least one signal amplifier;

an output module for dividing and recomposing the phase shifted and amplified incoming components so as to deliver:

in a given output port, a non-null amplified signal corresponding to the first input signal to be transmitted to the first earth station and;

in the other ports, resultants of components of the first test signal substantially null within the calibration errors.

Beneficially, the first test signal is a radiofrequency signal modulated by a data bit sequence coded by a pseudo-noise PN sequence in baseband, the PN sequence comprising a size N of symbols and a coding rate $T_{symbol}$.

Beneficially, the pseudo-noise PN sequence is chosen from a family of codes each having an orthogonality property.

Beneficially, the orthogonality of the sequence corresponds to the results of an auto-correlation of two same sequences one of which is temporally offset from the other by at least the duration of the symbol, the auto-correlation result having a level substantially obtained in the noise level.

Beneficially, the length N of the pseudo-noise sequence is computed so as to obtain an encoding gain higher than a minimum threshold, the encoding gain being defined by the ratio of the coding rate of the symbol of a pseudo-noise PN sequence to the coding rate of a data bit of a data bit sequence.

Beneficially, the auto-correlation peak of a pseudo-noise sequence has a normed value of 1 and in that apart from the correlation peak, the value of the auto-correlation function is in the order of 1/N.

Beneficially, the pseudo-noise PN sequence is chosen from the following list: {a Gold code type code, a "Maximum Length Sequence" type code, a Walsh-Hadamard code type code}.

According to a second embodiment, a first isolation threshold value between the first antenna of the first pathway and the second antenna of the second pathway is respected such that the power received from the signals of the first antenna at the second receiving station is considered as negligible as compared to the power of the signals received by the second receiving station from the second antenna.

In this second embodiment, at least two receiving stations are used to receive the signals. A benefit of this embodiment is to dispense with the implementation of a delay unit in one of the pathways of the satellite. On the other hand, it is desirable to make sure of a certain isolation level of the signals received in a station from an antenna of the satellite with respect to the signals transmitted from the other antennas.

Beneficially, the power deviation between the signals received by the second station from the first antenna and the signals received by the second station from the second antenna is higher than a predefined threshold.

Beneficially, the first isolation threshold value is defined by comparing the powers received in a receiver of the second station between the signals coming on the one hand from the first antenna and on the other hand from the second antenna.

Beneficially, the signals at the output of at least two antennas ($T_{X1}$, $T_{X2}$) of the MPA are biased with different biases so as to introduce a further isolation between both corresponding antennas.

According to a second embodiment:

a delay at the output of one of the pathways of the MPA is introduced so as to delay the signals at the output of the output port ($P_{S1}$, $P_{S2}$) of the corresponding pathway;

a single earth station allows the signals to be received at the output of each output port, the orientation of the first and second antennas allowing the reception of the signals from the first and second pathways at the first earth station.

A benefit of this second embodiment is to enable signals to be recovered in a same receiving station.

Beneficially, the duration of the delay generated on the transmitted signals is higher than a minimum duration corresponding to the period of a symbol of the PN sequence of the first test signal.

Beneficially, the delay is introduced by a delay unit at the output of one of the pathways of the MPA.

Beneficially, the delay unit is a delay line the length of which is dimensioned to introduce a desired delay.

Beneficially, one of the pathways of the MPA is connected to a telemetry antenna or a horn antenna and at least one delay unit is arranged between the pathways and the telemetry or horn antenna.

Beneficially, a delay is generated by means of a configuration of a network for forming coupled beams with the output ports of the MPA so as to assign to each output port signals including a predefined phase shift.

Beneficially, the receiver of the first earth station conducts an auto-correlation function of the signals received from each of the pathways on a predefined time window so as to discriminate the presence of each of the PN sequences in reception, the discrimination of both sequences resulting from an isolation achieved thanks to the delay injected in one of the pathways of the satellite.

Beneficially, the first test signal is transmitted on a pathway in the same frequency band as wanted telecommunications signals.

Beneficially, the steps are successively reiterated between different pathways of the MPA.

Another aspect of the invention relates to a method for calibrating a multi-port amplifier MPA of a satellite. The method comprises:

measuring a power level of the replica of the first test signal on a receiver of an earth station by means of the method for detecting an unbalance of a multi-port amplifier of the invention;

generating at least one calibration set point deduced from the measurements of powers of the signal comprising the replica of the first test signal;

transmitting said at least one calibration set point to the satellite.

Beneficially, at least one calibration set point comprises at least one phase shift set point and/or one gain set point.

Beneficially, the receiver of the receiving station, measuring the power of a signal corresponding to a replica of the first test signal at the output of a second pathway, transmits to a control station the data of powers collected such that the control station transmits a control signal to the satellite aiming at reconfiguring the MPA with the generated gain and/or phase shift set points.

A benefit of this calibration method is to be compatible with an operational state of the satellite. The transmissions of operators can be uninterrupted during the calibration method. A benefit is that the transmission of the test signal does not disturb the operational transmissions.

The calibration can be carried out by the telemetry antenna, hence the operational transmissions are not disturbed by the calibration signal.

BRIEF DESCRIPTION OF THE DRAWINGS

Further characteristics and benefits of the invention will appear upon reading the detailed description that follows, in reference to the appended drawings, which illustrate.

DESCRIPTION

In the present description, "signal leaks" from one pathway to another pathway of an MPA, refer to signals normally transmitted on a primary pathway via a first input port which are amplified by another pathway and resulting in directing signals in another output port of the MPA than the one which was intended to receive them.

The leaks are related to a poor isolation of the pathways of an MPA, which means that drifts of the amplifiers or phase shifters introduce phase shift deviations or amplification deviations which are not controlled at the output of the MPA.

Thus, a "path" of an MPA which can be configured by a variable gain is differentiated and a phase shifter and which takes a meaning from the point of view of the signal processed in said path, from a "pathway" which comprises an input port and an output port and which is associated with a receiving antenna and a transmitting antenna.

Butler Matrix/MPA

Figure 2:
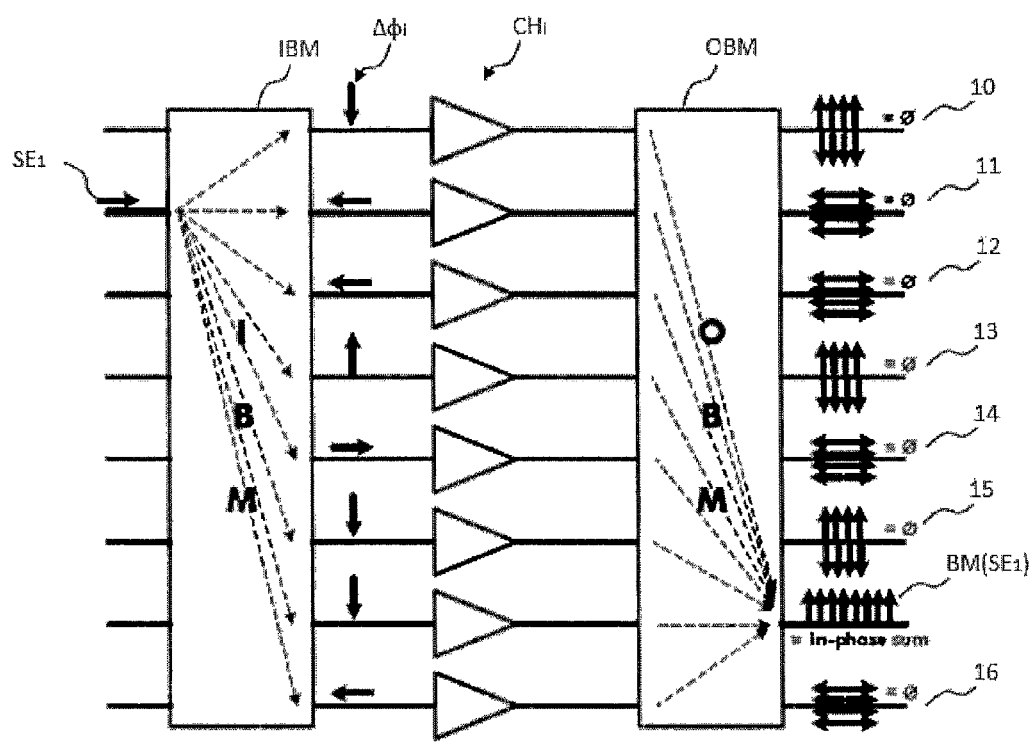
FIG. 2: an example of a Butler matrix used to implement an MPA.

FIG. 2 represents an MPA comprising a Butler matrix comprising 8 paths $CH_i$ connecting an input block, called IBM meaning "Input Butler Matrix", to an output block, called OBM meaning "Output Butler Matrix". The input block IBM comprises input ports $PE_i$. Each signal $S_{E1}$ coming in an input port of the input block IBM is divided into 8 components having equivalent amplitudes.

According to other embodiments, the number of input ports and of paths of the Butler matrix can be adapted depending on the case treated.

The division of the input signal introduces a phase shift $\Delta\Phi i$ between each component of the divided signal. Each component of the input signal $S_{E1}$ makes up a replica of the incoming signal, which replica is phase shifted from the other according to a phase shifting plan which is preset.

The Butler matrix comprises paths $CH_i$ enabling the input block IBM and the output block OBM to be joined, each of the paths $CH_i$ comprising an amplifier enabling each component having the same gain to be amplified. The output block OBM enables again each of the incoming amplified components to be divided into 8 other sub-components of equivalent amplitudes with a new phase shift. A total of 64 signals from the input signal $S_{E1}$ are generated.

The output block OBM is parameterized so as to obtain the resultant of any combination of the previously divided components at one of its output ports of the output block OBM. It is thus possible to obtain by summation cancellations of phase shifted signals such that a given resultant is null or amplifications of signals having the same phase shift.

FIG. 2 represents 8 outputs 10, 11, 12, 13, 14, 15, 16 and $BM(S_{E1})$ of the Butler matrix. In this example, the Butler matrix is configured such that the summed resultants of the components at the outputs 10, 11, 12, 13, 14, 15 and 16 are null or nearly null.

By way of example, the output 10 represents two summed components having an opposite phase shift which mathematically leads to a null resultant.

The output $BM(S_{E1})$ corresponds to a summation of the in-phase components, that is comprising the same phase shift, the resultant of the summed components being thus not null.

It is understood in light of FIG. 2 that a drift of an amplifier or a phase shifter in one of the paths of the Butler matrix can lead to non-null summations at some outputs whereas the configuration of the matrix is parameterized to obtain a cancellation of the summation of the components. These drifts can occur with aging of the components of the Butler matrix.

An embodiment of the invention thus allows a recalibration of the MPA by compensating for the drifts of the phases and/or amplitudes that can happen throughout the lifetime of the MPA. These compensations can be applied to the paths of the MPA, and/or to the input and output blocks of the Butler matrix.

An embodiment of the invention thus aims at solving the problem related to the isolation of the pathways of the MPA which is caused by a drift of the phase shifters and amplifiers of the Butler matrix.

In the present application, "a pathway" thus designates the set formed by:
  the input port of an MPA,
  the different paths used to phase shift and amplify the incoming signals and;
  the output port wherein the signals are recomposed.

A leak is observed when incoming signals in a given input port end up on an output port not belonging to the pathway associated with the input port.

Primary Pathway/Secondary Pathway

For the purposes of better understanding the invention, one of the pathways of the MPA called a "primary pathway" is distinguished from a "secondary pathway". The "primary pathway" is defined as the pathway designed to transmit and relay test signals for measuring the unbalance of the MPA. The test signals thus transmitted are received at the main input port $P_{E1}$. In the present description and the examples described, the primary pathway corresponds to the first pathway $V_1$ which connects the input port $P_{E1}$ to the output port $P_{s1}$. A first test signal $S_{E1}$ or first test signals $S_{E1}$ are indifferently referred to.

A "secondary pathway" for incoming signals in the main port of the primary pathway refers to a pathway wherein components of wanted signals have been amplified and summed with a phase or amplitude deviation which introduces significant leaks at the output of a port of a secondary pathway.

By convention, the pathway $V_1$ is the primary pathway receiving the test signals for recalibrating the MPA and the other pathways are secondary pathways. The method of an embodiment of the invention enables leaks to be measured at the output of these secondary pathways due to a poor calibration or to a drift of a previous calibration. In the present description, the pathway $V_2$ is used to describe in detail the mechanisms for measuring the leak levels according to the method of an embodiment of the invention. The secondary pathway corresponds to the second pathway $V_2$ which connects the input port $P_{E2}$ to the output port $P_{S2}$.

When an MPA is suitably calibrated, the leaks of the main signals generated at the output of a secondary port should be minimized to the maximum. In the case of an optimized calibration, the leaks become negligible from the point of view of the power generated causing an interference on the wanted signals passing through the secondary pathway.

When leaks are caused by a drift of the initial calibration of the MPA, phase and/or amplitude deviations in the Butler matrix cause the formation of signals from components of the main signal at the output of a port different from the main output port.

Operational Configuration

The method of an embodiment of the invention comprises a first step of transmitting a first signal $S_{E1}$ which is spread spectrum modulated from a first transmitting ground station $ST_{E1}$ to a first port $P_{E1}$ of a primary pathway, called first pathway $V_1$ of the multi-port amplifier MPA of the satellite. The first pathway $V_1$ is intended as the pathway conveying the wanted signal $S_{E1}$ from a first input port $P_{E1}$ to a second output port $P_{S1}$. A configuration of the MPA enables the components of the wanted signals to be conveyed in the Butler matrix which will be summed in phase at the output of the first output port $P_{S1}$ of the MPA. The other pathways are theoretically configured so as to produce a null resultant at the output of the other output ports $P_{Sk}$ as regards the conveying of the first signal $S_{E1}$. The wanted signal $S_{E1}$ produced at the input of the MPA different components of the signal which are phase shifted and amplified in different paths of the MPA and which are recomposed at the output port $P_{S1}$.

The method of an embodiment of the invention enables in particular the test signals $S_{E1}$ to be transmitted in the useful band of the first pathway $V_1$. Thus, the signal $S_{E1}$ which is spread spectrum modulated can be transmitted for the purposes of calibration tests at the same time as a wanted telecommunications signal passing through the same pathway $V_1$ for example through another transmitter yet without being detrimental to the latter transmission.

The first test signal $S_{E1}$ can comprise a data sequence coding a digital identification information. The latter is modulated for example by a pseudo-noise PN sequence as detailed in the following.

The transmitter $E_1$ based on an earth station $ST_{E1}$ transmits a signal, noted $S_{E1}$, modulated by a modulator. MOD by direct sequence spread spectrum (DSSS). The signal is thus transmitted at a low power and does not disturb much the neighboring communications and communications transmitted on the same primary pathway.

The method of an embodiment of the invention enables the measurement at the output of each secondary port $P_{Sk}$, of the part of the signal $S_{E1}$ which has produced leaks on the other pathways.

The signal $S_{E1}$ emitted enables according to the method of an embodiment of the invention the unbalance to be assessed between two pathways and thus the unbalance of the MPA by comparing, at the output of two different output ports $P_{S1}$ and $P_{Sk}$ of the MPA, the amplitudes of the signals from the summed components of the first signal $S_{E1}$. The leak level of the signal $S_{E1}$ on an output port $P_{Sk}$ the resultants of the components of the input signal $S_{E1}$ of which should be substantially null enable recalibration parameters of the paths of the MPA to be deduced therefrom.

The method of an embodiment of the invention indeed enables unbalances to be measured between the pathways $V_1$ and $V_2$ in particular by deducing the phase shift and gain parameter of the paths of the MPA. The method according to an embodiment of the invention enables the leak level to be measured at the downlink of the satellite to one or more receiving earth stations from which the measurements of the signal levels are carried out.

The method of an embodiment of the invention thus enables the power of a signal $SS_1$ emitted by the satellite to an earth station to be measured and quantified and then compared to the leak powers also emitted by the same satellite to an earth station. According to the different embodiments of the invention, the earth stations receiving the test signal SS1 having been relayed by the satellite and the leaks can be the same receivers or receivers of different earth stations.

Figure 3A:
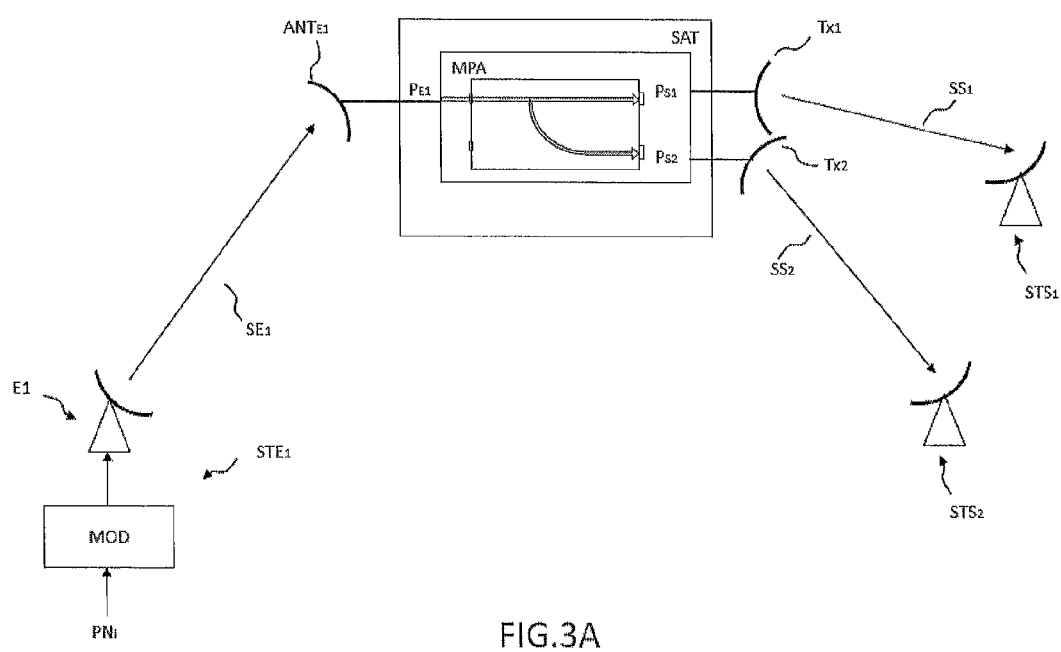
FIG. 3A: a block diagram of the means to be implemented to carry out a transmission of a signal from a first transmitting station to the satellite for carrying out the method of the invention.

The measurements can be deduced from the signals received on receiving earth stations such as the stations $STS_1$ and $STS_2$ represented in FIG. 3A. According to the embodiments of the invention, the stations can:
- be different and sufficiently far to ensure an isolation between a primary pathway and a secondary pathway;
- be identical when the method enables the signals from each pathway to be discriminated independently of each other.

The measurements are carried out from:
- on the one hand, context data such as the positions of the earth stations and data of signal attenuation model according to the position of the satellite and)
- on the other hand, data specific to the signals received such as their power and the correlations of the spread spectrum modulated signal.

Spread Spectrum Modulation

The method of an embodiment of the invention enables a particularly beneficial spread spectrum modulation to be defined by means of pseudo-noise PN sequences. The pseudo-noise PN sequences enable a test signal $S_{E1}$ which can be embedded in terms of power in a power received by the satellite of a wanted signal emitted simultaneously on the same pathway $V_1$ to be generated. The properties of a modulation of a signal by a pseudo-noise PN sequence enables the signal $S_{E1}$ to be discriminated upon reception by an appropriate demodulation.

Indeed, one of the benefits of the use of the direct sequence spread spectrum modulated signals is that they do not disturb the current transmissions carried out by the satellite, including in particular the transmissions of operators and broadcasters of contents defining operational communications. The interferences between the wanted signals and the signals $S_{E1}$ are thereby limited by the nature of the spread spectrum modulated signals. Therefore, there is no deterioration of the quality of service of the current communications upon measuring an unbalance of an MPA according to the method of an embodiment of the invention and during the calibration procedure of the MPA. The pathway $V_1$ which is tested by the method of the invention can thus be jointly used by an operator transmitting data signals intended for example for Tv broadcasting.

As previously set out, an example of signal generated by direct sequence spread spectrum having a particular interest in the method of the invention is a PN sequence type signal, meaning "Pseudo-Noise", which can be intended as a pseudo-noise sequence.

A first benefit of the PN sequence is that it can be detected by a receiver which demodulates the signal received from the primary pathway $V_1$ of the secondary pathway $V_2$. By applying the decoding of the sequence of data received on a given time span, the PN sequence being known, an auto-correlation function enables to detect whether a sequence contained in the signal is present or not.

One of the problems solved by an embodiment of the invention is in particular the discrimination of a PN sequence in reception from a primary pathway from the one contained in the leak signals from a secondary pathway.

Introduction of Both Embodiments

According to the embodiments, the PN sequence in reception at an earth station can be detected in different ways to solve this problem. The invention provides, for example, two main embodiments of the method of the invention relying on the same inventive concept using:

in a first mode, the method enables a delay generated on one of the secondary pathways to be introduced so as to discriminate on the ground:
  a PN sequence received from the primary pathway $V_1$ which has not been delayed;
  a replica of a PN sequence comprised in leak signals at the output of a secondary port.
in a second mode, by ensuring a sufficient isolation between a primary pathway and a secondary pathway and more particularly antennas connected to these pathways, the isolation allowing the discrimination on the ground of:
  a PN sequence received from the primary pathway which has not been delayed;
  a replica of the PN sequence comprised in leak signals at the output of a secondary port.

In the present description, a discrimination of a PN sequence means a PN sequence modulated by the data bits. It will be appreciated that a demodulation operation enables from a signal carrier(s) the data modulated in baseband to be extracted.

First Mode: Delay Unit

First, let us consider a first embodiment. When the method of the invention comprises generating a delay on a secondary pathway, the method enables this delay to be dimensioned by adapting the ratio between:
  the size of the PN sequence;
  the delay unit on the satellite.

PN Sequence/Coding, PG

Let us investigate first the choice of the PN sequence, its size and its code type. The size of the PN sequence is defined by a coding rate, noted $T_{symbol}$.

The coding rate $T_{symbol}$ can be expressed:
  either as a number of symbols generated per second that can be coded or transmitted;
  or as a number of symbols coding a data bit, the data bits being transmitted at a bit rate per second, noted $T_{bit}$.

The bit encoding gain is introduced by a PN sequence by the function PG:
  $PG = 10 \log (T_{symbol}/T_{bit})$
  If for example the PN sequence includes 10 symbols for a bit coding, then PG=10 dB.

Figure 1:
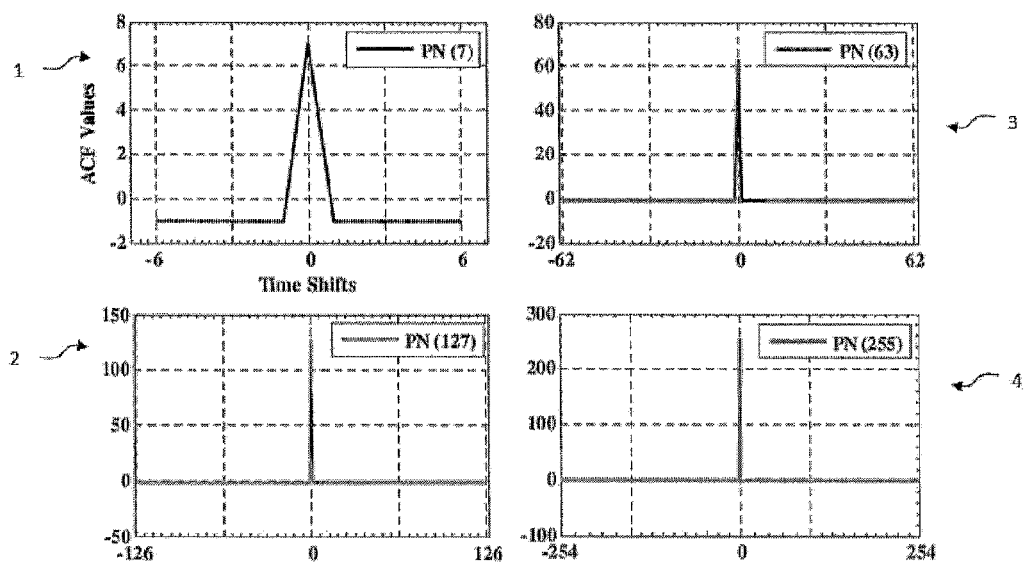
FIG. 1: different responses to auto-correlation functions based on different lengths of pseudo-noise sequences.

FIG. 1 represents different PN sequences of different sizes, this is a so-called "Gold code".

A benefit of the use of PN sequences is the orthogonality of the sequences generated. Indeed, the product/correlation of the PN sequence with any sequence is close to zero in that the mean value obtained is close to zero, whereas the auto-correlation of a PN sequence with itself gives a maximum as is illustrated in FIG. 1 by different results of the auto-correlation function of a PN function.

It is observed that the longer the PN sequence, the more important the orthogonality criterion of the sequences. The peak maximum of the auto-correlation function enables high peaks to be obtained. This is a first benefit for the detection of the PN sequence and which can be more readily found in the received signal.

Another benefit can be achieved in light of FIG. 1 which shows that an offset of at least one symbol between two same auto-correlated sequences between them, enables a level of the auto-correlation product to be obtained in the noise level.

The use of a long PN sequence, that is having a high coding rate $T_{symbol}$ enables a nearly null product of the auto-correlation function of two PN sequences which are offset by at least one or more symbol duration $D_{symbol}$ to be obtained.

Thus, the introduction of a delay on a secondary pathway of a duration at least equal to or higher than that of a $D_{symbol}$ enables in reception both PN sequences from the primary pathway and a secondary pathway to be dissociated when signal leaks are observed.

The method of an embodiment of the invention thus enables a PN sequence to be adapted with a high coding rate $T_{symbol}$ so as to decrease the requirement on the delay unit on the satellite.

Indeed, when the delay unit is a delay line, its length is proportional to the delay desired to be introduced.

Let us consider an exemplary case wherein the following configuration is given:
  a 72 MHZ channel in the Ku band;
  a downlink carrier frequency of 11 GHz
  the wavelength will then be $(3 \cdot 10^9)/(11 \cdot 10^8) = 2.72$ cm
  an SSSD sequence with an encoding rate of 50 Mchip/s
  a roll-off factor of $\varsigma = 0.4$.

It is assumed that PG=60 dB on the amplification chain which corresponds to a bit coding rate of 50 bits/s.

Therefore, the period of a symbol is 20 ns in this example. This gives, for a delay line technology, a line length in the order of 6 meters for a wavelength of 220λ.

It is thus understood that the higher the PG, the less the length of the delay line, which enables the overall space to be reduced in the satellite.

PN Sequence/Code Type

Numerous code sequences can be used with the method of an embodiment of the invention such as the following known sequences: Gold codes, "Maximum Length Sequences", Walsh-Hadamard codes and even other sequences.

In the embodiment consisting in injecting a delay on one of the secondary pathways, the method according to the invention thus enables the delay to be restricted to one symbol duration $D_{symbol}$ or more by taking advantage of the orthogonality properties of the PN sequences. These properties enable in reception a PN sequence from a primary pathway to be discriminated from the same PN sequence from a secondary pathway.

The method according to an embodiment of the invention can thus comprise optimizing the value of the encoding gain PG by decreasing the transmission rate of a data bit.

The method of an embodiment of the invention uses the generation of such a PN sequence in a transmitted signal $S_{E1}$ from a transmitting station $STE_1$ transmitting the signal to a satellite SAT. In the embodiment involving the generation of a delay, the latter will be introduced at the output of the output port $P_{S2}$ of the MPA by convention with regard to the example illustrated in FIG. 3A.

At the receivers located in each earth station, the signals are detected, demodulated, and possibly time stamped. The amplitudes of the signals and powers are computed. The main signal is designated as that following the transmission pathway intended to that end, that is the pathway $V_1$ connecting the input port $P_{E1}$ to the output port $P_{S1}$, by following the different paths of the MPA after decomposition and recomposition of the signal received at the input port $P_{E1}$. The replicas contained in the leaks present in at least another port are designated as the signals from the main signal but whose recompositions at the output of another port have not generated null or substantially null signals in accordance with the calibration of the MPA.

In the embodiment generating a delay at the output of the pathway $V_2$, the PN sequence at the output sequence of a secondary port is offset by at least one symbol duration $D_{symbol}$ to discriminate in reception this sequence from the PN sequence of the primary pathway. Temporally offsetting the replica of the main sequence by injecting a delay enables the replica to be unambigously detected at the receiver of the earth station, when both sequences are received by the same receiver for example.

Another implementation is to use a decoding algorithm of the main PN sequence and of the useful data of the primary pathway $V_1$. Once these data are demodulated, they can be used to deduce the presence of the same PN sequence from a secondary pathway in the signal received by correlating the signal received by the PN sequence modulated by the data bits. But this method requires a software implementation specific for decoding.

Implementation of the Delay

Figure 5:
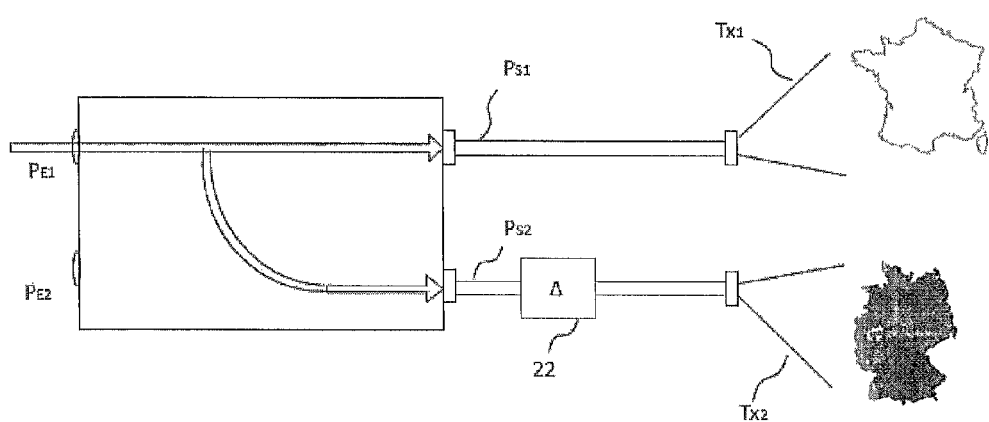
FIG. 5: an embodiment of the invention comprising a line delay unit on one of the pathways of an MPA, for example the one represented in FIG. 3A.

Let us detail this first embodiment upon reading FIG. 5 which represents a delay unit 22 on a secondary pathway.

In this first embodiment, a first alternative is to place on the pathway $V_2$ or at the output of a secondary pathway of the MPA a delay unit enabling a line delay to be introduced. The latter enables the signals to be delayed at the output of the output port $P_{S2}$.

By way of example, each output port MPA could be equipped with delay lines, which are filters, capable of providing the phase delay contemplated. A practical means consists in using a wave guide technology. It is then desirable that deteriorations associated with these filters should be lower than 0.1 dB. This enables the output power not to be too degraded.

To that end, a delay unit 22 can be arranged at the output of the output port $P_{S2}$ of the MPA as illustrated in FIG. 5.

Several Delay Units

According to other alternative embodiments, delay units are present at the output of each pathway. The latter as previously detailed enable in reception measurements of powers of signal leaks in a secondary pathway of the MPA to be carried out. In this case, each delay unit can have its own delay enabling in reception a replica of the sequence originally transmitted on the primary pathway and leaking to other pathways to be isolated.

A benefit of defining a different delay on each pathway is to enable each pathway to be uniquely adjusted with respect to a reference pathway. This enables the desired tests to be performed without disturbing the links of useful data passing through while the method of an embodiment of the invention is carried out. There is no service outage of the MPA during the calibration phase and the preliminary phase enabling the calibration values of the MPA to be deduced.

Consequently, the part of the components of the main signal forming leaks on a secondary output port, for example on the pathway $V_2$, are delayed by a delay defined between the pathway $V_1$ and the pathway $V_2$: $\Delta T_{V2/V1}$.

A Single Delay Unit

According to another alternative, only one pathway is equipped with a delay unit and all the calibration measurements are performed by comparing the measurements of a pathway to that being equipped with a delay unit. In this case, it is desirable to put the delay unit on a primary pathway to delay the main signals and not to delay the leaks.

According to this first embodiment, the receiver $STS_2$ receives two signals from the satellite the powers of which can be isolated thanks to the delay being taken into account.

The measured power relating to the part of the signal received corresponding to the leaks enables the deduction of phase and amplitude calibration set point values to be applied to the MPA.

Delay with a Network of Beams

According to a second embodiment not using a delay unit on the pathways, it is possible to benefit from a configuration enabling delays to be generated on each pathway of the MPA by using a network for forming beams allocated to a specific configuration of the output ports of the MPA. For example, when a network for forming beams is beneficially coupled with the output ports of the MPA and different coverages for each antenna according to a given phase shift configuration of the signals transmitted on each pathway of the MPA. This configuration enables the signals to be phase shifted on each pathway by a given delay such that each targeted earth station receives a signal phase shifted for example by a multiple of a delay $T_0$.

If a delay $T_0$ is introduced between the first pathway $V_1$ and the second pathway $V_2$, each delay introduced in the other pathways of an MPA can be, for example, a multiple of the delay $T_0$. Therefore, there is a delay of $2 \cdot T_0$ for the pathway $V_3$, a delay of $3 \cdot T_0$ for the pathway $V_4$.

Delay with an Output Port not Used by the MPA

Finally, a third alternative enabling delays to be generated on each of the pathways of the MPA consists in using an output port not used by the communications of the MPA. This output port can then be configured with a low power delay line which is connected to a horn antenna which is for example used for the telemetry link or the transmission of a Beacon signal.

The replica of the sequence which is delayed is received at an earth station ensuring the telemetry link.

In this solution, each measurement of power deviation of the signal leaks is performed between the primary pathway tested and the pathway connected to the port connected to the delay line and the horn antenna. Calibration values of the MPA are then deduced. Each pathway can then be calibrated with respect to the same test pathway using the horn antenna. This solution has the benefit of requiring only few hardware changes, except for the delay line to be integrated in the unused port.

Depending on the case, a configuration of activating a delay at the output of an output port $P_{S2}$ of a secondary pathway $V_2$ can be triggered according to the testing procedures initiated at given periods and predefined durations. Thus, it is not necessary for example in the previous alternative using the horn for the delay line to generate permanently a delay on all the signals passing through this pathway.

The solution allowing the use of an unused output port of the MPA for the purposes of introducing a delay offers an efficient solution. This output port can be the second port $P_{S2}$. In this case, the antenna $Tx_2$ is a horn antenna in this example.

In this way, the signal corresponding to the leaks amplified and transmitted by the horn antenna $TX_2$ via the unused port $P_{S2}$ is noted $SS_2$. The replica of a main sequence is offset in time by the duration necessary which has been configured in the function of the delay unit. The signal $SS_2$ is transmitted to an earth station intended to receive the telemetry signals for example.

If the MPA is not properly calibrated, then the receiver of the earth station is able to detect a power of signals received. It is then able to deduce therefrom the presence of a replica of the same PN sequence transmitted on the primary pathway thanks to the introduction of the delay on the secondary pathway and thanks to the implementation of an auto-correlation function.

One of the solutions used in the case of the communication passing through the primary pathway is that consisting in introducing a delay at the output of the port $P_{S2}$ and using an output port of the MPA not used by the operational communications. Then, $Tx_2$ which is a horn antenna as detailed in this third alternative is used.

The introduction of the delay allows the isolation level between the pathways to be dispensed with. Indeed, a minimum isolation of at least 40 dB between the power received on the ground of each pathway is desired. This requirement necessitates to receive the signals in two different stations and sufficiently far from each other to achieve the desired isolation requirements.

The delay can be generated by means for example of a delay line, such as a low power coaxial cable at the output of the output port $P_{S2}$. The delayed signal can be attenuated by the delay unit and the gain of the telemetry antenna, also called a "horn antenna", which is lower than the gain of a radio-communication antenna connected to the MPA such as the antenna $T_{x1}$. The gain of the telemetry antenna is lower than the gain of the antenna $T_{x1}$, approximately lower by 20 to 30 db. Thus, the power difference between the main sequence emitted by $T_{X1}$ and the replica emitted by $T_{X2}$ in reception in the earth station $STS_2$ can be 20 dB+20 dB=40 dB.

For the auto-correlation function to maintain a high performance under these conditions, it is then desired to dimension the size N of the pseudo-noise PN sequence so as to maximize its detection by the receiver $STS_2$.

Analysis of the Signals in Reception

A third benefit of the method using the introduction of a delay is that it enables the signals not to be necessarily decoded, the auto-correlation function applied to the signals received on a given time window allow:

the presence of the PN sequence received and transmitted by the primary pathway to be detected the presence of the same PN sequence replicated from a secondary pathway to be detected when leaks occur on at least one secondary port $P_K$.

These detections can be deduced from the result of the auto-correlation functions without decoding the sequences.

Thus, there is no need to use a decoding algorithm which enables a step of analyzing the data in reception to be avoided. Only the power of the signal received can be measured and the results of the auto-correlation functions.

The analysis of the power of the signal received comprising a replica of the sequence from a secondary pathway enables parameters for rebalancing the MPA to be deduced.

The method of an embodiment of the invention can be applied to each secondary pathway by comparing the signals received between a secondary pathway and a primary pathway.

The deductions of parameters of phase shift(s) and gain deviation(s) of the amplifiers of the MPA are obtained by analyzing the power levels of the leaks at the output of each pathway and thus on the ground after receiving the signals emitted by the satellite SAT.

A computing step enables the rebalancing parameters which have to be applied to the MPA according to a calibration method to be deduced.

A calibration of the MPA can thus be initiated when the detection method enables leak values at the output of each pathway to be deduced.

2nd Mode

According to another embodiment, a delay is not necessarily introduced into a secondary pathway to discriminate the part of the signal corresponding to the main signal of the leaks.

As already introduced previously, a problem encountered in this case is the isolation of the earth stations with respect to each other from signals which are not intended thereto. The method of an embodiment of the invention enables this problem to be solved in this second embodiment.

This embodiment requires the signals from the primary pathway and the signals from a secondary pathway comprising leaks to be received in two earth stations sufficiently isolated from each other in frequency. The signals received at each station each including the same PN sequence modulated by the data bits can thus be simultaneously received and be a posteriori analyzed:

either by performing a decoding, a level measurement and a comparison of the demodulated data;

or by an auto-correlation function applied to both signals received and time stamped and by analyzing the correlation peak.

FIG. 3A represents a transmitter $E_1$ of an earth station $STE_1$. A signal $S_{E1}$ is modulated by a pseudo-noise $PN_i$ sequence and transmitted to the satellite via an uplink. It is then considered a second pathway $V_2$ connected to an output port $P_{S2}$. The first pathway $V_1$ is connected to an Output port $P_{S1}$.

Figure 3B:
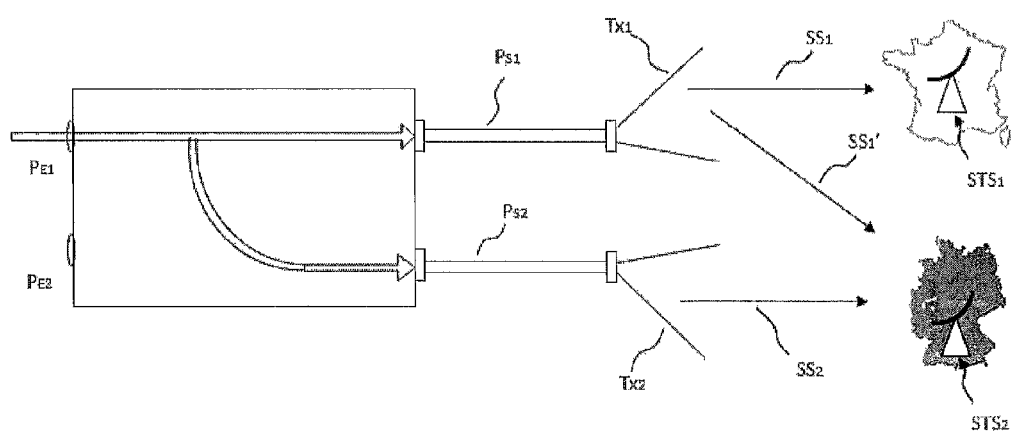
FIG. 3B: an example of an MPA comprising at least two primary pathways.

Each output antenna $T_{X1}$ and $T_{X2}$ is oriented according to a broadcasting configuration. FIG. 3B proposes an exemplary configuration enabling this second embodiment relying on a good isolation of the primary way with a secondary pathway to be better understood. For example, the output antenna $T_{X1}$ connected to the first port $P_{S1}$ is directed so as to broadcast in a zone in France FR whereas the output antenna $T_{X2}$ connected to the second port $P_{S2}$ is directed so as to broadcast in a German zone DE. The output signal of the antenna $T_{X1}$ is noted $SS_1$ and the output signal of the antenna $T_{X2}$ is noted $SS_2$.

The example of coverage of the French and German zones will be taken to detail a case enabling the invention to be better understood, but the method of the invention is applied with the proviso that two receiving stations offer a sufficient isolation between them.

The satellite SAT receives the signal $S_{E1}$ on a receiving antenna $ANT_{E1}$. The antenna delivers the signal received on a first port $P_{E1}$ of the MPA. When the MPA is not calibrated, signals recomposed at the output of secondary ports can generate leaks which include a trace of the sequence $PN_i$ modulated by the data bits. The leaks are generated according to the principles explained in connection with FIG. 2 upon recomposing components of signals theoretically summed in opposite phase.

The measurement of the leak powers comprising the $PN_i$ sequence can be performed by analyzing the power received on the station $STS_2$. This analysis allows unbalance values to be deduced therefrom and thus calibration set points of the MPA to be deduced therefrom in the same way as in the first embodiment.

In the example illustrated in FIG. 3B, when one is in a reception zone in Germany, FIG. 3B illustrates that a part $SS_1'$ of the signals transmitted by the antenna $TX_1$ of the signals $SS_1$ arrives at the receiver $STS_2$ in the zone in Germany DE. This is due to a non-isolation of 100% between coverage zones which are not totally disjointed because of the geographical proximity of the zones. For example, the border towns between Germany and France will be more subject to the consequences of an insufficient isolation by receiving the signals from both antennas.

In Germany, when no signal is injected on the input port $P_{E2}$, the receiver $STS_2$ thus receives the sum:
of the signals transmitted by the first antenna $T_{X1}$ and having been attenuated by the distance and tilting between the antenna $T_{X1}$ of the satellite and the receiver located in Germany;
of the signals having leaked from the first pathway $V_1$ to the second pathway $V_2$.

Figure 4:
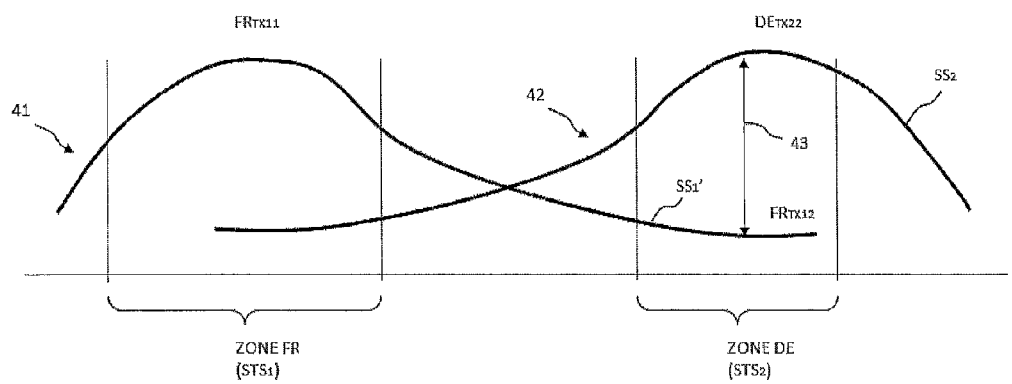
FIG. 4: power curves of signals received by earth stations corresponding to the example of FIG. 3B: according to the respective position with regard to pointing of the antennas of the different pathways.

FIG. 4 enables the levels of signals received at each earth station to be illustrated.

The power received at the earth station $STS_2$ thus comprises:
a first part $SR_{STS2}$ (A) amplified by the antenna $T_{X1}$ but partially geographically isolated and;
a second part $SRSTS_2$ (B) amplified by the antenna $T_{X2}$ coming from the leaks of the MPA caused by an unbalance of the same.

Curve 41 represents the power of the signal from the antenna $T_{X1}$ which is intended to cover the zone located in France. It is observed that the power is actually maximum in the coverage zone FR and that this power decreases in neighboring zones including the zone DE located in Germany.

In the same way, curve 42 represents the power of the signal from the antenna $T_{X2}$ intended to cover the zone located in Germany. It is observed that the power is actually maximum in the coverage zone DE and that this power decreases in the neighboring zones including the zone FR located in France.

From the point of view of a receiver $STS_2$, located in Germany in the zone DE, it receives the sum of the power of the signals from both antennas including $T_{X1}$ and $T_{X2}$.

In order to better understand the curves of FIG. 4, let us call:
the gain $FR_{TX11}$ the gain of the signals at the output of the antenna $T_{X1}$ and arriving at the receiver $STS_1$ and;

the gain $FR_{TX12}$: the gain of the signals at the output of the antenna $T_{X1}$ and arriving at the receiver $STS_2$, these signals are noted $SS_1'$ and;
the gain $DE_{TX22}$: the gain of the antenna connected to the second pathway $V_2$ ensuring the coverage of German zone and thus of the receiver $STS_2$,
the received power $SR_{STS2}$: the power of the signals received at the receiver $STS_2$,
the leaks $SS_{V1 \to V2}$ at the output of the antenna $T_{X2}$ from the non-null recomposition of components of the signal $S_{E1}$ on a secondary pathway.

It is obtained: $SR_{STS2} = SR_{STS2}(A) + SR_{STS2}(B)$
With:

$$SR_{STS2}(A) = (SS1 \cdot FR_{TX12})$$

$$SR_{STS2}(B) = (SS_{V1 \to V2} \cdot DE_{TX22})$$

When the MPA is perfectly calibrated, that is there is no leak on the pathway $V1$ on the output port $P_{S2}$, theoretically there should be:
$SS_{V1 \to V2} \approx 0$ and thus $SR_{STS2}$ (B)$\approx 0$ In this case, the receiver $STS_2$ located in the German zone in the same example as previously, only receives the signal $SS_1'$ from the antenna $T_{X1}$ and thus the power called $SR_{STS2}$ (A). Let us specify that signals $SS_1$ and $SS_1'$ are identical, only the gain in reception of these signals differs from one earth station to another as a function of the direction of the pointing angle of the antenna and the isolation of the antenna.

When the MPA is unbalanced, signals transmitted by a secondary pathway comprising the PN sequence modulated by the data bits end up at the output of a secondary pathway $P_{S2}$. The leaks, noted $SS_{V1 \to V2}$, are non-null and have a power attempted to be measured at an earth station isolated from the station receiving the signals from the primary pathway $V_1$.

In the same example as previously, the receiver located in the zone in Germany receives a part of the signal from the antenna $T_{X1}$ which ensures the zone coverage in France and a part of the signals amplified by the amplifiers of the pathway $V_2$ from the pathway $V_1$.

FIG. 4 represents both parts of the power received from the signals $SS_1'$ and $SS_2$ by the receiver $STS_2$.

When no wanted signal is transmitted on the pathway $V_2$, there is:

$$SS_2 = SS_{V1 \to V2}$$

Indeed, only the leaks of the phase shifted components of the signal $S_{E1}$ summed at the output of the MPA are emitted in this case by the antenna $T_{X2}$.

The method of the invention enables the measurement of the only part of the signal received at the receiver $STS_2$ coming from the components of the main signal of the pathway $V_1$ which are recomposed at the output of a secondary port and thus forming leaks on the output port $P_{S2}$. The measurement of these leaks enables an unbalance value of the MPA to be deduced therefrom.

The same measurements can be applied to each pathway by taking for each measurement, a primary reference pathway, in our case we have taken $V_1$ and the port $P_{E1}$ as the port receiving the main test signal for measuring the unbalance of the MPA.

This second embodiment requires an isolation threshold to be chosen between both antennas $T_{X1}$ and $T_{X2}$ and thus a configuration of the antennas $T_{X1}$ and $T_{X2}$ and their orientation pointing two sufficiently far earth stations.

When the isolation of the signals emitted between both pathways is sufficient, the power received from the signals amplified by the main pathway $V_1$ and received in the receiver $STS_2$ are negligible relative to the power of the signals from the leaks of the signals of the pathway $V_1$ on the output port $P_{S2}$.

Concretely, the ratio 43 can be appreciated with regard to FIG. 4. When the power of the signal received by the station $STS_2$ is maximum, the power of the signal $SS_1'$ from the antenna $TX_1$ is negligible.

This second embodiment is to define a solution aiming at controlling the isolation between the transmitting antennas $T_{X1}$ and $T_{X2}$ of the satellite.

By choosing stations of each zone sufficiently far, for example "Brest" for France and "Berlin" for Germany, the signals at the output of the port $P_{S1}$ to Brest in the France zone will hardly disturb the signals received in a station located in Berlin in the Germany zone. The power of the signals received in Berlin by the antenna $T_{X2}$ will be much higher than the power of the signals emitted by $T_{X1}$ and received in Berlin which are considered of a negligible power.

It is considered that the attenuations are sufficiently strong and thus the coverages of these towns sufficiently disjoint to consider the power of the signal $SS_1'$ as negligible in reception of the receiver $STS_2$ located in Berlin.

The method of an embodiment of the invention enables an unbalance of the MPA to be measured in particular by comparing the power of the leaks from one pathway to the other.

In our exemplary case, the power of the signals received in Berlin, that is the station $STS_2$, from the pathway $V_1$ and the port $P_{S1}$ and thus the antenna $T_{X1}$ should be negligible relative to the power of the signals from the pathway $V_2$ and from the port $PS_2$ thus the antenna $T_{X2}$ corresponding to the leaks of the signals from the pathway $V_1$ to the pathway $V_2$.

In this example, it is assumed that no signal is injected in the input port $P_{E2}$ of the pathway $V_2$ intended to transmit on the antenna $T_{X2}$.

The only signals present at the output port $PS_2$ will be the leaks of signals injected at the input of the input port $P_{E1}$ intended to be transmitted via the antenna $T_{X1}$.

Let us consider an exemplary case wherein the unbalance of the MPA is 20 dB.

If the isolation between the antennas $T_{X1}$ and $T_{X2}$ enables a difference of more than 20 dB between them, then the power of the signal $SS_1'$ in reception at the station $STS_2$ will be negligible relative to the power received from the leaks due to the unbalance of the MPA. The choice of the earth stations $STS_1$ and $STS_2$ taken as sufficiently far from each other thus contributes to isolating both antennas $T_{X1}$ and $T_{X2}$ from each other.

At the earth station $STS_2$, two cases can occur:
either no signal is detected and the MPA is then well calibrated, that is the unbalance of the MPA is lower than an acceptable threshold;
or a signal is detected and the spread spectrum sequence is received. The received power of the signal can be detected and measured. In this case, the knowledge of the gain of the antenna $T_{X2}$ and the knowledge of the isolation enable the unbalance of the MPA to be deduced therefrom.

In an embodiment, several coverage zones can be reached with the antenna $T_{X2}$. The measurements of received power can then be made in different geographical points, that is in different stations. The results can then be consolidated by comparison of the powers received in different earth stations. This enables the unbalance levels of the MPA to be validated and verified with more certainty.

The isolation between both antennas $T_{X1}$ and $T_{X2}$ can also be improved by assigning signals of a certain bias to the antenna $T_{X1}$ and another bias to the antenna $T_{X2}$. It can be for example reverse or orthogonal biases. This solution enables the received powers of the signals received at the station $ST_2$ from the antenna $T_{X1}$ to be minimized.

A benefit of this method is that no hardware change of the satellite is required.

One of the main benefits of the use of a spread spectrum signal is that it is compatible with an operation allowing these tests to be performed while maintaining a continuity of service for telecommunication operators. Indeed, the spread spectrum sequences do not disturb the wanted signals passing through the MPA. A benefit is that at the receiver of the earth station $STS_2$, the wanted communications can be easily processed so as to only retain the sequence received by spread spectrum.

This property does not prevent the method of an embodiment of the invention from being compatible with a mode wherein wanted communications pass through the pathway $V_2$. In this case, the MPA processes incoming signals in the input port $P_{E2}$ and conveys them to the output port $P_{S2}$. Coming back to the previous example with an isolation of 20 dB between both antennas at the ground stations, the unbalance value which is detectable at the station $STS_2$ is 20 dB.

Calibration of the MPA

Different methods of the invention enable to measure whether an unbalance of the MPA is present or not. When an unbalance of the MPA is detected in a testing procedure, a calibration value is deduced. The calibration for example of the different paths of the MPA can be carried out. A calibration of a path consists for example in:
introducing a phase shift of a variable phase shifter so as to obtain a predefined phase plan between each path and;
adjusting a variable gain of an amplifier of each path of the MPA.

Identically, the calibration of the input modules IBM and the output OBM modules can be calibrated according to the concerned components.

The phase and/or amplitude of each path of the MPA can thus be adjusted according to one or more set point(s). The phase or amplitude change of a path is likely to generally impact all the pathways of the MPA (link of an input port with an output port).

To carry out the calibration of the MPA, phase and/or amplitude calibration set points should be transmitted to the satellite. A control station enables calibration set points to be generated to the satellite from measurements of powers made in a station $STS_2$. These set points can be addressed by means of control orders for example thanks to the telemetry link.

The calibration set points can be applied for each path of the MPA or the input IBM or output OBM modules. Each path can be calibrated after the other according to an iteration of parameters allocated to each component, including in particular the phase shifters and amplifiers.

The calibration enables the unbalances of the MPA to be corrected. The unbalance of the MPA can have been caused by the redundant use of a TWTA amplifier tube of a path of the MPA or even a change in the response time of a TWTA amplifier or the drift of some passive components of the different paths of the MPA.

A testing plan for measuring unbalances of the MPA can be conducted so as to generate a calibration plan. The calibration can then again be tested according to the same method and be readjusted if need be by an iteration of the calibration procedure.

The method of an embodiment of the invention is applicable to any MPA in particular those present in broadcasting satellites and including geostationary satellites.

The method of the invention is however applicable to any type of satellite comprising an MPA.

Having described and illustrated the principles of the invention with reference to various embodiments, it will be recognized that the various embodiments can be modified in arrangement and detail without departing from such principles. It should be understood that the devices, modules, transmitters, receivers, programs, processes, or methods described herein, and more generally any elements of the structural arrangement, including the amplifier for satellite, described herein are not related or limited to any particular type of computing environment, unless indicated otherwise. Various types of specialized computing environments may be used with or perform operations in accordance with the teachings described herein. Elements of embodiments shown in software may be implemented in hardware and vice versa.

One or more devices, processors or processing devices may be configured to carry out the function(s) of each of the elements and modules of the structural arrangement, including the amplifier for satellite, described herein. For example, the one or more devices, processors or processing devices may be configured to execute one or more sequences of one or more machine executable instructions contained in a main memory to implement the method(s) or function(s) described herein. Execution of the sequences of instructions contained in a main memory causes the processor to perform at least some of the process steps or function(s) of the elements described herein. One or more processors in a multi-processing arrangement may also be employed to execute the sequences of instructions contained in a main memory or computer-readable medium. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to a processor for execution. Such a medium is non-transitory and may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor for execution.

Computer programs comprising machine executable instructions for implementing at least one of the steps of the method described herein or function(s) of various elements of the structural arrangement, including the amplifier for satellite, described herein can be implemented by one or more computers comprising at least an interface, a physical processor and a non-transitory memory (also broadly referred to as a non-transitory machine readable or storage medium). The computer is a special purpose computer as it is programmed to perform specific steps of the method(s) described above. The non-transitory memory is encoded or programmed with specific code instructions for carrying out the above method(s) and its/their associated steps. The non-transitory memory may be arranged in communication with the physical processor so that the physical processor, in use, reads and executes the specific code instructions embedded in the non-transitory memory. The interface of the special purpose computer may be arranged in communication with the physical processor and receives input parameters that are processed by the physical processor.

It will be appreciated by one skilled in the art that the disclosed arrangements and methods described herein represent a solution to the technological problem currently faced by satellite designers for detecting an unbalance of a multi-port amplifier intended to be on-board a satellite.

The invention claimed is:

1. A method for detecting an unbalance of a multi-port amplifier intended to be on-board a satellite, the multi-port amplifier comprising a plurality of paths, each path being configurable in gain and in phase, the multi-port amplifier comprising a plurality of input ports and a plurality of output ports, each input port being associated with an output port to form a pathway, each output port being connected to an antenna of the satellite, wherein a first pathway is configured in frequency in a transmission channel defining a first useful band to receive signals from a transmitting station on a ground and to retransmit them via a first antenna after amplification in the multi-port amplifier to a first earth station of a first geographical zone, a second output port of a second pathway being configured to transmit via a second antenna to a second earth station of a second geographical zone, said method comprising:
    transmitting a first test signal which is spread spectrum modulated from the first transmitting station to the first pathway of the multi-port amplifier, the first test signal being generated in at least the first useful band of the first pathway;
    receiving by the second earth station configured in frequency to receive signals transmitted by the second antenna connected to the second pathway of the multi-port amplifier, said signals received by the second earth station being likely to comprise a replica of the first test signal;
    detecting and measuring at least one power of received signals corresponding to the replica of the first test signal having leaked at the output of the second output port;
    computing at least one unbalance value of the multi-port amplifier from the measurement of the power of the replica of the first test signal received in the second earth station.

2. The method for detecting an unbalance of a multi-port amplifier according to claim 1, wherein the multi-port amplifier comprises a Butler matrix comprising:
    an input module for generating, from the first test signal, a plurality of phase shifted components with a same amplitude to a plurality of paths connecting the input module to an output module;
    a plurality of paths each comprising at least one signal amplifier;

the output module for dividing and recomposing the phase shifted incoming components that are amplified so as to deliver:
in a given output port, anon-null amplified signal corresponding to the first test signal to be transmitted to the first earth station; and
in other ports, resultants of components of the first test signal substantially null within the calibration errors.

3. The method for detecting an unbalance of a multi-port amplifier according to claim 1, wherein the first test signal is a radio frequency signal modulated by a data bit sequence coded by a pseudo-noise sequence in baseband, the pseudo-noise sequence comprising a size of symbols and a coding rate.

4. The method for detecting an unbalance of a multi-port amplifier according to claim 3, wherein the pseudo-noise sequence is chosen from a family of codes each having an orthogonality property.

5. The method for detecting an unbalance of a multi-port amplifier according to claim 4, wherein an orthogonality of a sequence corresponds to the results of an auto-correlation of two same sequences one of which is temporally offset from the other by at least the duration of the symbol, the auto-correlation result having a level substantially obtained in a noise level.

6. The method for detecting an unbalance of a multi-port amplifier according to claim 5, wherein a length of the pseudo-noise sequence is computed so as to obtain an encoding gain higher than a minimum threshold, the encoding gain being defined by the ratio of the coding rate of the symbol of a pseudo-noise sequence to the coding rate of a data bit of a data bit sequence.

7. The method for detecting an unbalance of a multi-port amplifier according to claim 3, wherein an auto-correlation function of the pseudo-noise sequence is such that an auto-correlation peak of the pseudo-noise sequence has a normed value of 1 and wherein apart from the auto-correlation peak, the value of the auto-correlation function is in the order of 1/N, where N is a length of the pseudo-noise sequence.

8. The method for detecting an unbalance of a multi-port amplifier according to claim 3, wherein the pseudo-noise sequence is chosen from a following list: a Gold code type code, a Maximum Length Sequence type code, a Walsh-Hadamard code type code.

9. The method for detecting an unbalance of a multi-port amplifier according to claim 1, wherein a first isolation threshold value between the first antenna of the first pathway and the second antenna of the second pathway is respected such that the power received from the signals of the first antenna at the second earth station is considered as negligible as compared to the power of the signals received by the second earth station from the second antenna.

10. The method for detecting an unbalance of a multi-port amplifier according to claim 9, wherein a power deviation between the signals received by the second station from the first antenna and the signals received by the second earth station from the second antenna is higher than a predefined threshold.

11. The method for detecting an unbalance of a multi-port amplifier according to claim 9, wherein the first isolation threshold value is defined by comparing powers received in a receiver of the second earth station between the signals coming on the one hand from the first antenna and on the other hand from the second antenna.

12. The method for detecting an unbalance of a multi-port amplifier according to claim 1, wherein the signals at the output of at least two antennas of the multi-port amplifier are biased with different biases so as to introduce a further isolation between both corresponding antennas.

13. The method for detecting an unbalance of a multi-port amplifier according to claim 1, wherein:
a delay at the output of one of the pathways of the multi-port amplifier is introduced so as to delay the signals at the output of the output port of the corresponding pathway;
a single earth station allows the signals to be received at the output of each output port, an orientation of the first and second antennas allowing the reception of the signals from the first and second pathways at the single earth station.

14. The method for detecting an unbalance of a multi-port amplifier according to claim 13, wherein the duration of the delay generated on the transmitted signals is higher than a minimum duration corresponding to the period of a symbol of the pseudo-noise sequence of the first test signal.

15. The method for detecting an unbalance of a multi-port amplifier according to claim 13, wherein the delay is introduced by a delay unit at the output of one of the pathways of the multi-port amplifier.

16. The method for detecting an unbalance of a multi-port amplifier according to claim 15, wherein the delay unit is a delay line the length of which is dimensioned to introduce a desired delay.

17. The method for detecting an unbalance of a multi-port amplifier according to claim 13, wherein one of the pathways of the multi-port amplifier is connected to a telemetry antenna or a horn antenna and wherein at least one delay unit is arranged between the pathway and the telemetry or horn antenna.

18. The method for detecting an unbalance of a multi-port amplifier according to claim 13, wherein a delay is generated by means of a configuration of a network for forming coupled beams with the output ports of the multi-port amplifier so as to assign to each output port signals including a predefined phase shift.

19. The method for detecting an unbalance of a multi-port amplifier according to claim 13, wherein a receiver of the first earth station conducts an auto-correlation function of the signals received from each of the pathways on a predefined time window so as to discriminate the presence of each pseudo-noise sequence in reception, the discrimination of both sequences resulting from an isolation achieved thanks to the delay injected in one of the pathways of the satellite.

20. The method for detecting an unbalance of a multi-port amplifier according to claim 1, wherein the first test signal is transmitted on a pathway in a same frequency band as wanted telecommunication signals.

21. The method for detecting an unbalance of a multi-port amplifier according to claim 1, wherein the transmitting, receiving, detecting, and computing are successively reiterated between different pathways of the multi-port amplifier.

22. A method for calibrating a multi-port amplifier of a satellite, comprising:
measuring a power level of the replica of the first test signal on a receiver of the second earth station by means of the method for detecting an unbalance of a multi-port amplifier according to claim 1;
generating at least one calibration set point deduced from the measurements of powers of the replica of the first test signal;
transmitting said at least one calibration set point to the satellite.

23. The method for calibrating a multi-port amplifier of a satellite according to claim 22, wherein the at least one calibration set point comprises at least one phase shift set point and/or one gain set point.

24. The method for calibrating a multi-port amplifier of a satellite according to claim 23, wherein the receiver of the second earth station, measuring the power of a signal corresponding to the replica of the first test signal at the output of the second pathway, transmits to a control station collected data of powers such that the control station transmits a control signal to the satellite aiming at reconfiguring the multi-port amplifier with the generated gain and/or phase shift set points.

* * * * *